United States Patent
Thompson et al.

(10) Patent No.: US 11,503,701 B1
(45) Date of Patent: Nov. 15, 2022

(54) ELECTRONIC DEVICE HAVING HEAT TRANSFER CLAMP AND ASSOCIATED METHODS

(71) Applicant: EAGLE TECHNOLOGY, LLC, Melbourne, FL (US)

(72) Inventors: Jason Thompson, Melbourne, FL (US); Marcus Ni, Rockledge, FL (US); Voi Nguyen, Oviedo, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 0 days.

(21) Appl. No.: 17/452,243

(22) Filed: Oct. 26, 2021

(51) Int. Cl.
*H05K 1/02* (2006.01)
*H05K 7/14* (2006.01)
(Continued)

(52) U.S. Cl.
CPC ......... *H05K 1/0209* (2013.01); *H05K 7/1404* (2013.01); *F16B 2/04* (2013.01); *H05K 7/2029* (2013.01)

(58) Field of Classification Search
CPC ......... H05K 7/00; H05K 7/12; H05K 7/1404; H05K 7/14; H05K 7/1418; H05K 7/20; H05K 7/20272; H05K 7/20263; H05K 7/2029; H05K 7/20336; H05K 7/20327; H05K 7/20454; H05K 7/20481; H05K 7/2049; H05K 7/20509; H05K 7/20672; H05K 1/02; H05K 1/0203; H05K 1/0209; H05K 2201/064; H05K 2201/066; H01L 23/00; H01L 23/34; H01L 23/367; H01L 23/40; H01L 23/427; H01R 43/26;
(Continued)

(56) References Cited

U.S. PATENT DOCUMENTS 4,994,937 A * 2/1991 Morrison ............. H05K 7/1409
361/720
6,678,159 B1 * 1/2004 Barcley .............. H05K 7/20545
174/16.3
(Continued)

FOREIGN PATENT DOCUMENTS

CN 107209382 B 5/2020
EP 1498013 B1 12/2007
(Continued)

OTHER PUBLICATIONS

Thompson et al., U.S. Appl. No. 17/452,241, filed Oct. 26, 2021.

*Primary Examiner* — Zachary Pape
*Assistant Examiner* — Amir A Jalali
(74) *Attorney, Agent, or Firm* — Allen, Dyer, Doppelt, + Gilchrist, P.A.

(57) ABSTRACT

An electronic device may include a circuit board, a heat generating component carried by the circuit board, a heat transfer rail extending along an edge of circuit board and coupled to the heat generating component, a housing covering the circuit board, and a heat transfer clamp between the heat transfer rail and the housing. The heat transfer clamp includes a flexible, heat conductive layer having a first portion in thermal contact with the heat transfer rail and a second portion in thermal contact with the housing. The first and second portions are thermally coupled, and a clamp and a compressible layer thereon extends between the first and second portions of the flexible, heat conductive layer.

21 Claims, 9 Drawing Sheets

(51) Int. Cl.
*F16B 2/04* (2006.01)
*H05K 7/20* (2006.01)

(58) Field of Classification Search
CPC ......... H01R 43/205; H01R 43/46; G06F 1/20; F28D 15/00; F16B 2/14; F16B 2/02
See application file for complete search history.

(56) References Cited

U.S. PATENT DOCUMENTS

| | | |
|---|---|---|
| 7,776,657 B2 | 8/2010 | Dani et al. |
| 8,477,500 B2 * | 7/2013 | Deng ................. H01L 23/3736 |
| | | 361/720 |
| 9,066,453 B2 | 6/2015 | Wagner et al. |
| 9,357,670 B2 * | 5/2016 | Stutzman ............. H05K 7/2039 |
| 10,215,504 B2 | 2/2019 | Coteus et al. |
| 10,586,909 B2 | 3/2020 | Das et al. |
| 10,788,864 B2 | 9/2020 | Aurongzeb et al. |
| 10,791,652 B2 | 9/2020 | Thompson et al. |
| 10,982,913 B2 | 4/2021 | Hemker et al. |
| 2006/0065974 A1 | 3/2006 | Kumaus et al. |
| 2011/0058335 A1 * | 3/2011 | Sullivan ............. H05K 7/20709 |
| | | 361/704 |
| 2011/0141692 A1 * | 6/2011 | Bult .................... H05K 7/20672 |
| | | 361/700 |
| 2014/0146475 A1 | 5/2014 | Buckman et al. |
| 2015/0168087 A1 * | 6/2015 | Kim ........................ C09K 5/063 |
| | | 361/720 |
| 2017/0023310 A1 | 1/2017 | Hemker et al. |
| 2017/0034900 A1 | 2/2017 | Strader |
| 2019/0380225 A1 * | 12/2019 | Thompson ........... H05K 7/1427 |
| 2020/0307158 A1 | 10/2020 | Sinfield et al. |

FOREIGN PATENT DOCUMENTS

| | | |
|---|---|---|
| JP | 2016165543 A | 9/2016 |
| JP | 6178863 B2 | 7/2021 |
| KR | 20170130482 A | 11/2017 |
| KR | 102159135 B1 | 9/2020 |
| TW | 201110282 A | 3/2011 |
| TW | I489597 B | 6/2015 |
| WO | 2016/149500 | 9/2016 |

* cited by examiner

ELECTRONIC DEVICE HAVING HEAT TRANSFER CLAMP AND ASSOCIATED METHODS

FIELD OF THE INVENTION

The present invention relates to the field of cooling electronic devices, and, more particularly, to cooling heat generating components carried by a circuit board and related methods.

BACKGROUND OF THE INVENTION

As electronic packaging density increases and dissipated power increases to achieve higher levels of electronic performance, the need for efficient thermal transport within electronic devices having printed circuit boards is increasing. Brute force heat transfer techniques involving forced air, active liquid cooling, and similar heat transport mechanisms have been used to transport heat from sensitive heat generating components to heat sinks or similar heat spreading devices. Power dissipation may be a major concern for electronic components mounted on printed circuit boards and used in commercial and rugged (ground/avionics/space) applications.

Some embedded systems are approaching the limits of thermal management. For example, some electronic components dissipate up to 100 watts at peak loads requiring more complex heat transfer and conduction techniques using combinations of graphite composites and heat pipes to spread the heat efficiently. Some embedded systems require tight tolerances to reduce the space between the component and heat sink. However, the component tolerance itself may not be controlled, and thus, bond lines between 20 and 60 mils may lead to high temperature drops from 5° C. to 15° C. depending on the power and the thermal interface material (TIM) used with the heat generating component. Some heat transfer systems use composite structures to aid heat conduction away from the component, for example, annealed pyrolytic graphite (APG) embedded within metallic skins, or their combination with heat pipes that are physically connected to spreader plates by solder, epoxy, or clamps.

These heat transfer systems have benefits and shortcomings depending on the application and environment. This degradation over time is caused, for example, by thermal cycling. Through-plane conductivity is also a concern for APG composites because graphite is orthotropic, and its through-plane conductivity is lower because of the orientation of in-plane graphite fibers. However, there are some applications where the through-plane conductivity is an advantage. Some markets are shifting to two-piece modular heat sinks and targeted heat pipes where designs significantly reduce thermal interface material (TIM) bond lines, but may not be incorporated into a 6U or 3U standard module due to their size. These common form factor sizes are often used for high bandwidth applications that must work within the constraints of SWaP (size, weight and power) considerations governed by established industry standards, e.g., VITA standards. There are drawbacks, however, of having a heat sink/heat pipe directly bolted to a printed circuit board because there are thin bond lines of less than 1 mil, while flexible heat conductors may not be conformable and have limited adjustability.

SUMMARY OF THE INVENTION

In general, an electronic device may include a circuit board, a heat generating component carried by the circuit board, a heat transfer rail extending along an edge of circuit board and coupled to the heat generating component, a housing covering the circuit board, and a heat transfer clamp between the heat transfer rail and the housing. The heat transfer clamp may comprise a flexible, heat conductive layer comprising a first portion in thermal contact with the heat transfer rail and a second portion in thermal contact with the housing. The first and second portions may be thermally coupled, and a clamp and a compressible layer thereon may be between the first and second portions of the flexible, heat conductive layer. The compressible layer may comprise a compressible matrix, and a phase change material may be within the compressible matrix. The flexible, heat conductive layer may have a loop shape comprising at least one sidewall portion coupled between the first and second portions.

The clamp may comprise a wedge clamp body and a rotatable shaft associated therewith. The heat transfer rail may have a v-shaped surface in contact with the first portion of the flexible, heat conductive layer. The flexible, heat conductive layer may comprise at least one of graphite and copper.

Another aspect is directed to a method for securing a circuit board within a housing. The circuit board may have a heat generating component carried thereby and a heat transfer rail extending along an edge of the circuit board. The method may comprise sliding the circuit board into the housing, and tightening a heat transfer clamp between the heat transfer rail and the housing. The heat transfer clamp may comprise a flexible, heat conductive layer that may comprise a first portion in thermal contact with the heat transfer rail and a second portion in thermal contact with the housing. The first and second portions may be thermally coupled, and a clamp and a compressible layer thereon may be between the first and second portions of the flexible, heat conductive layer.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION

The present description is made with reference to the accompanying drawings, in which exemplary embodiments are shown. However, many different embodiments may be used, and thus, the description should not be construed as limited to the particular embodiments set forth herein. Rather, these embodiments are provided so that this disclosure will be thorough and complete. Like numbers refer to like elements throughout, and prime notation is used to indicate similar elements in different embodiments.

Figure 1:
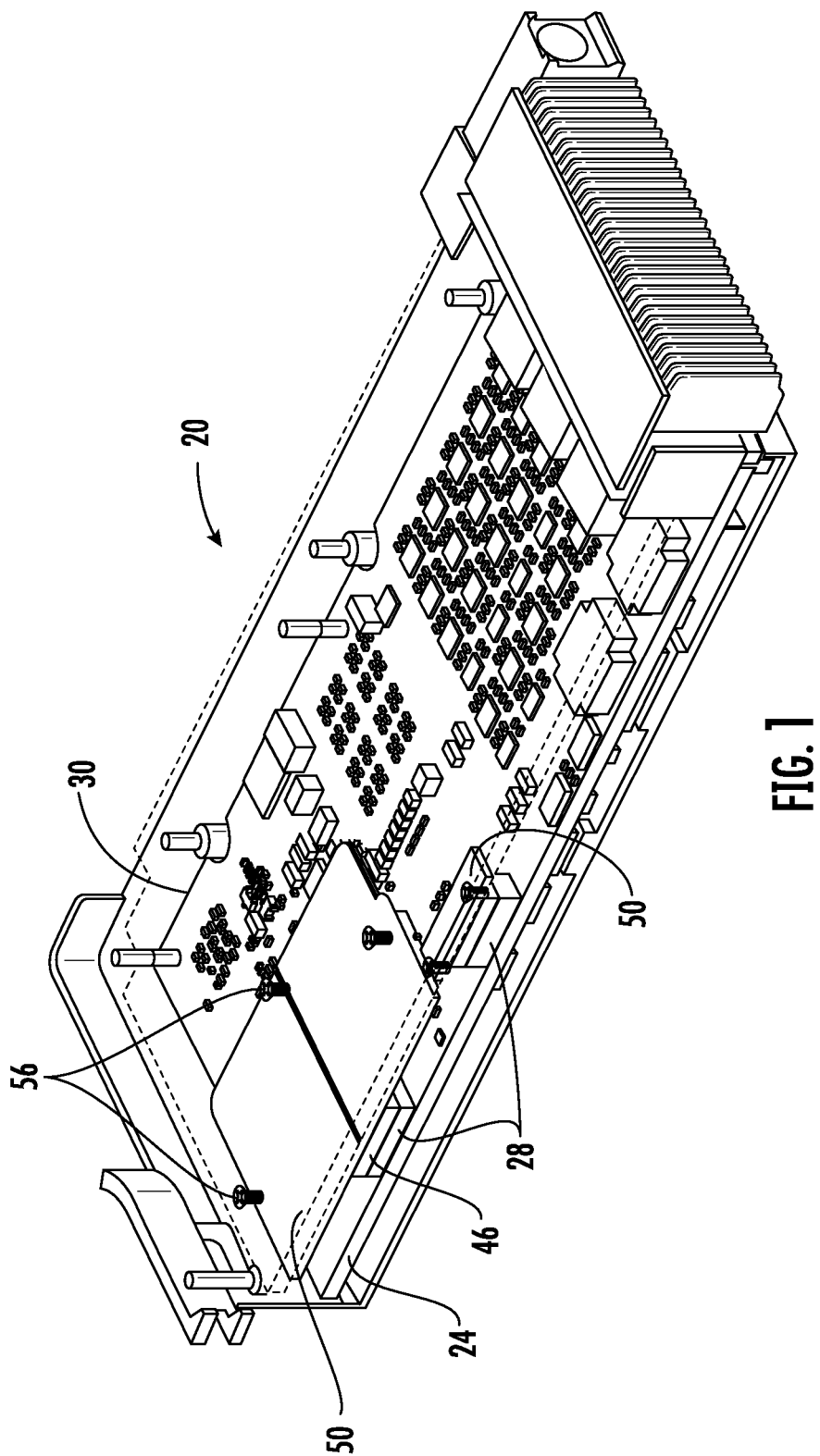
FIG. 1 is an isometric view in partial section of a first embodiment of the electronic device showing the heat transfer assembly using a fastener as an alignment feature in accordance with a non-limiting example.
Figure 2:
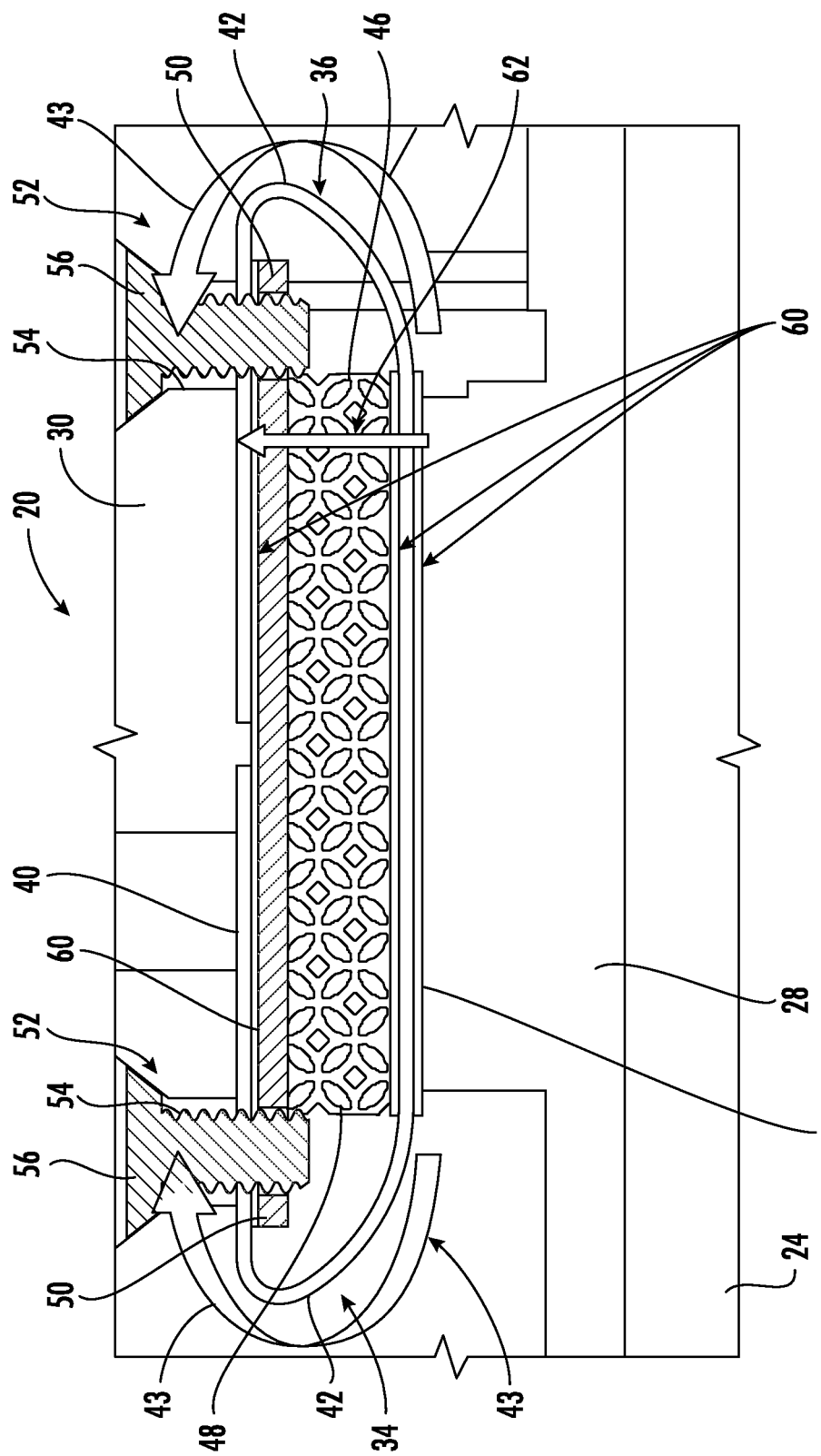
FIG. 2 is a partial sectional view of the electronic device of FIG. 1 showing details of the heat transfer assembly.
Figure 3:
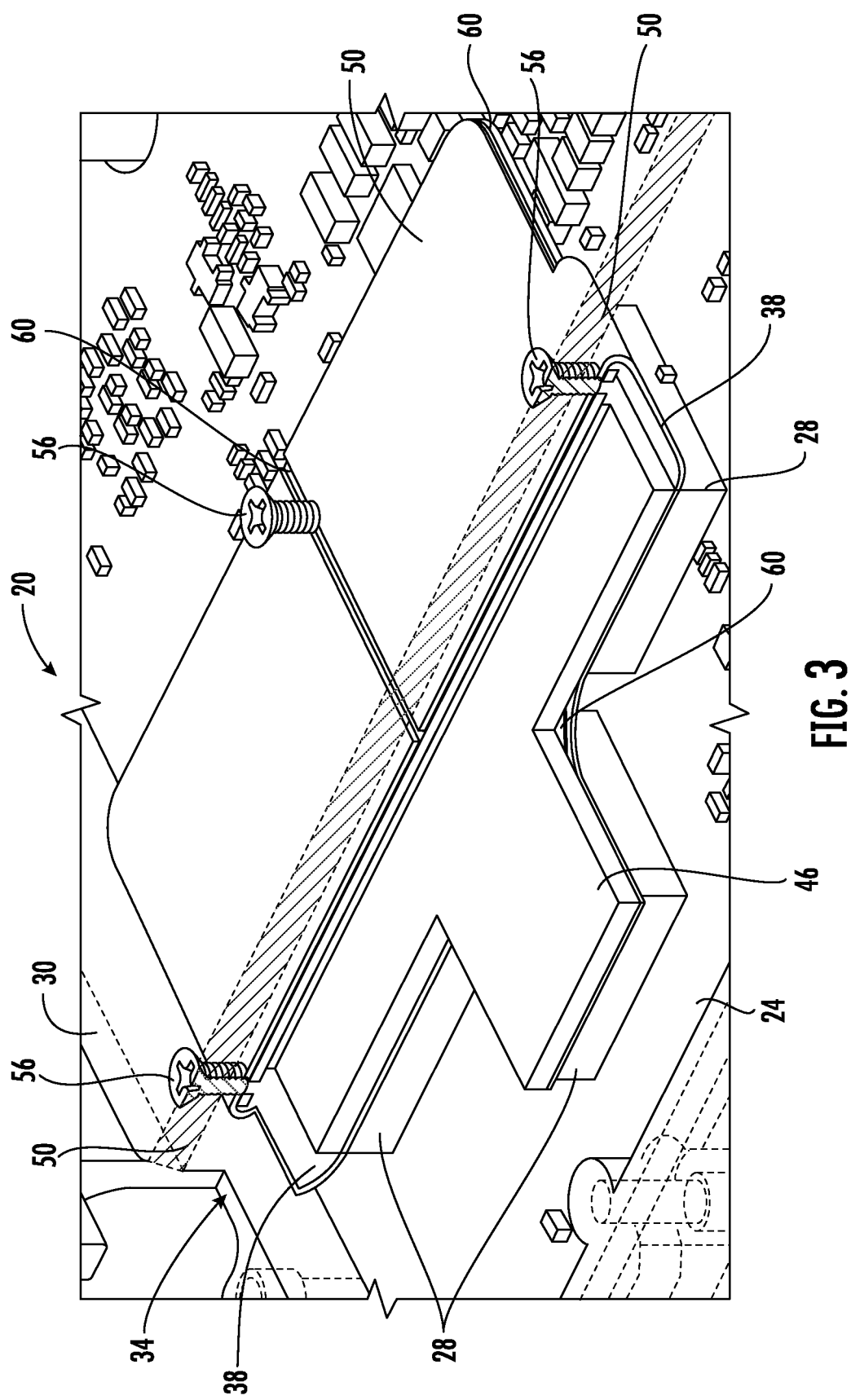
FIG. 3 is a broken isometric view of the electronic device of FIG. 1.

Referring now to FIGS. 1-3, an electronic device, such as a plug-in electronic module, is illustrated generally at 20 and includes a circuit board 24 and a heat generating component 28 such as a microprocessor or other electronic component carried by the circuit board. The circuit board 24 may be formed as a conventional printed wiring board (PWB) or similar structural circuit board. A heat sink body 30 is formed as a planar-configured plate or thick, flat heat transfer sheet member as in this example shown in FIGS. 1 and 2. A heat transfer assembly indicated generally at 34 (FIG. 2) is positioned between the heat generating component 28 carried by the circuit board 24 and heat sink body 30. In this example, the heat transfer assembly 34 includes a flexible, heat conductive layer 36 that includes a first portion 38 in thermal contact with the heat generating component 28, and a second portion 40 in thermal contact with the heat sink body 30. The first and second portions 38,40 are thermally coupled to each other, and in this example, this thermal coupling is accomplished by a sidewall portion 42 so that the layer 36 has a loop shape. For example, the flexible, heat conductive layer 36 may be formed from a graphite or copper sheet or other thin sheet material that conducts and transfers heat such as a pyrolytic graphite sheet (PGS) as shown by the arrows at 43, indicative of a primary thermal path for heat flow.

A compressible layer 46 is formed as a compressible matrix and positioned between the first and second portions 38,40 of the flexible, heat conductive layer 36 and may include a phase change material 48 within the void areas defined by the compressible matrix. In this example shown in the schematic diagram of FIG. 2, the heat transfer assembly 34 includes a rigid cover 50 formed in this example as a threaded nut plate positioned between the compressible layer 46 and the second portion 40 of the flexible, heat conductive layer 36 that contacts that heat sink body 30. At least one alignment feature indicated generally at 52 cooperates with the heat sink body 30 and includes a passageway 54 that extends through the heat sink body and the rigid cover 50 as the threaded nut plate to allow a fastener 56 such as a nut to extend therethrough and secure the heat sink body against the compressible layer 46 and tighten the first and second portions 38,40 into thermal contact with the heat generating component 28 and heat sink body, and pull the nut plate towards the heat sink body. The flexible heat conductive layer 36 in an example may be formed of at least one of graphite and copper as noted before, such as a pyrolytic graphite sheet or similar materials to aid in heat transfer.

In this example, a conductive layer 60, such as a thermally conductive pressure sensitive adhesive or thermal grease, is applied between the rigid cover 50 as the threaded nut plate in this example, and the second portion 40 of the heat conductive layer 36 that is in thermal contact with the heat sink body 30. A conductive layer 60 is also applied between the first portion 38 of the flexible, heat conductive layer 36 and the compressible layer 46 as the compressible lattice and another conductive layer applied between the heat generating component 28 and the first portion 38 of the flexible, heat conductive layer 36. The use of the compressible layer 46 permits heat to transfer in a secondary thermal path as shown by the arrow at 62.

The electronic device 20 of FIG. 1 is shown as having two heat generating components 28 spaced from each other on the circuit board 24. That drawing view is in partial section and illustrates two separate rigid covers 50 that cover the respective heat generating components 28, and each having alignment features 52 as a fastener 56 as illustrated. This electronic device 20 is formed as an electronic module that may be plugged into a rack assembly or other similar component or module housing configuration.

In the broken isometric view of the electronic device 20 of FIG. 3, three heat generating components 28 are illustrated and cooperate with one heat sink body 30 that is shown in a partially transparent configuration over the compressible layer 46, and the rigid cover 50 as a threaded nut plate in this example. This electronic device 20 incorporating the heat transfer assembly 34 may be used with multiple heat generating components 28 simultaneously. The heat sink body 30 may be formed as one large integrated heat sink body or divided into multiple, smaller plate members. The rigid cover 50, such as a threaded nut plate, may be formed from multiple plate members or one large plate member.

Figure 4:
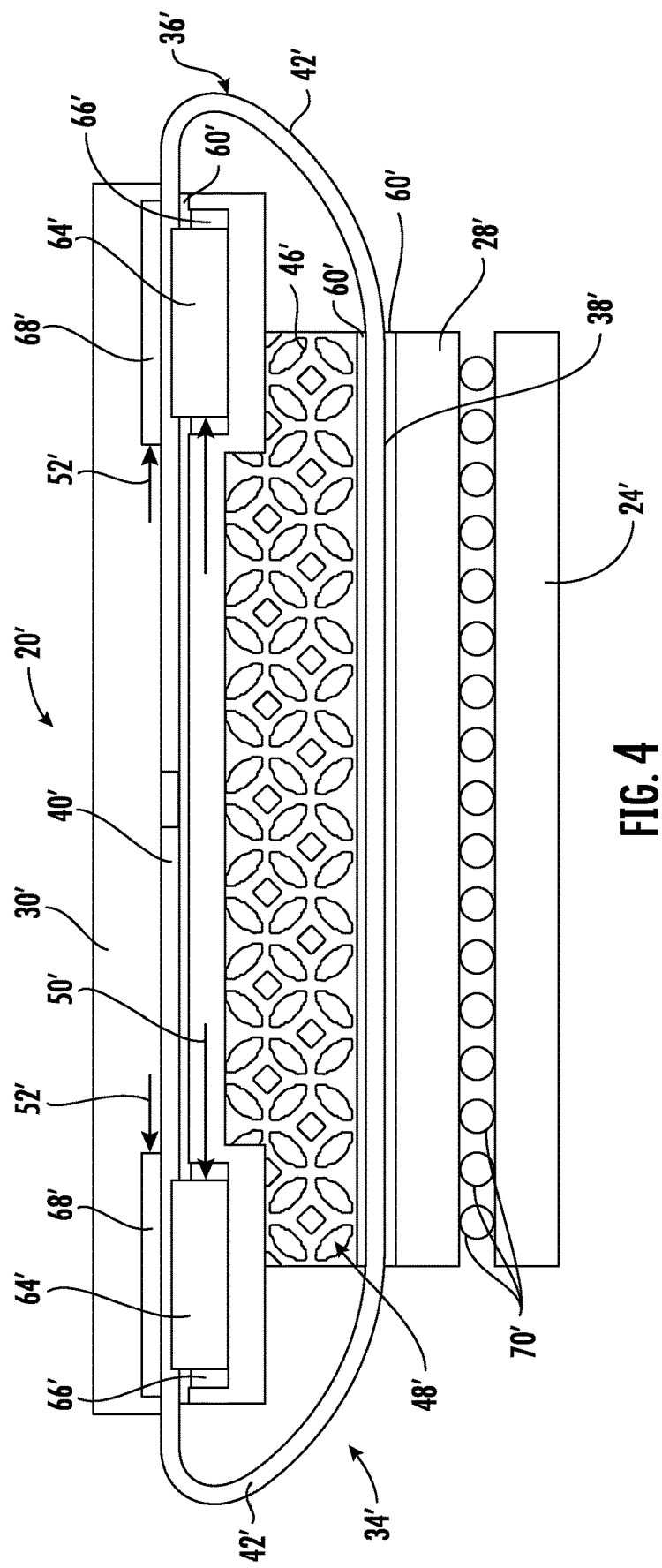
FIG. 4 is a schematic sectional view of a second embodiment of the electronic device showing the heat transfer assembly using a magnetic body as an alignment feature.

Referring now to FIG. 4, a second embodiment of the electronic device 20' is illustrated where the rigid cover 50' includes at least one alignment feature 52' cooperating with the heat sink body 30'. In this embodiment, the at least one alignment feature 52' is a magnetic body 64' formed as magnets that may be embedded into cavities 66' of the rigid cover 50' as a mechanical plate. Opposite polarity magnets 68' may be embedded in the underside of the heat sink body 30' to aid in alignment of the various components and aid in compression of the compressible layer 46'. In the embodiment shown in FIG. 4, the heat generating component 28 includes a ball grid array package that contains conductive contact balls 70' that contact and are secured to the circuit board 24'. The heat generating component 28 described relative to the electronic device 20 of FIGS. 1-3 likewise may be formed as a ball grid array package.

As noted before, the flexible, heat conductive layer 36,36' (FIGS. 1-4) may be formed as a pyrolytic graphite sheet that is about 25 microns thick, but as much as an inch or more in width and which is primarily directional in the heat flow to allow heat flow longitudinally along the sheet, but not transverse across its thickness. This flexible, heat conductive layer 36,36' is similar to a flexible thermal strap and addresses tolerance gaps between a heat generating component 28,28' and the heat sink body 30,30'. The compressible layer 46,46' as a compressible lattice provides flexibility for expansion and contraction and balances contact pressure, damping, thermal transport, and mechanical retention characteristics. The use of the alignment features 52,52' provides an inherent adjustability and self-alignment with structural registration and provides a damping effect due to the compressible layer as a compressible lattice. The incorporation of the compressible layer 46,46' and flexible, heat conductive layer 36,36' provides a multi-path heat transport mechanism with adaptable mechanical retention by either the use of magnetic bodies 64',68' or the passageway 54 and fasteners 56 that extend through the rigid cover 50,50'. The use of the compressible layer 46,46' also provides not only in-plane flexibility, but also provides resistance to fatigue events because of the disparate thermal expansion rates of coupled components. It also imparts pressure for improved thermal conductivity at coupled interfaces and provides a physical registration and alignment between coupled components. An added benefit of the compressible layer 46,46' is the inherent damping it provides between coupled components such as the heat generating component 28,28' and the heat sink body 30,30'. The compressible layer 46,46' may be manufactured using injection molding techniques or additive manufacturing, such as 3D printing. The compressible layer 46,46' may be made from metal to enhance spread of thermal energy through the phase change material.

As noted before, the compressible layer 46,46' may be infused with a phase change material 48,48' either within its open volume or within an arterial network of ligaments that store thermal energy. Different types of phase change materials 48,48' may be used, such as a wax material that absorbs heat and melts or other material having a high heat of fusion. The compressible layer 46,46' may be encased within a plastic or other flexible membrane so that when compressed, the phase change material 48,48' such as a wax material and the compressible layer itself will not bulge and extend beyond the membrane holding the compressible layer.

The flexible, heat conductive layer 36,36', as the example pyrolytic graphite sheet, may be formed from other flexible nano-materials that have heat conductive capability, including copper sheet or other flexible heat conductive metal, and flexible metal-matrix composites. Another example construction for the flexible, heat conductive layers 36,36' includes thermally conductive woven fibers, and in some examples, even a flexible heat pipe construction.

Figure 5:
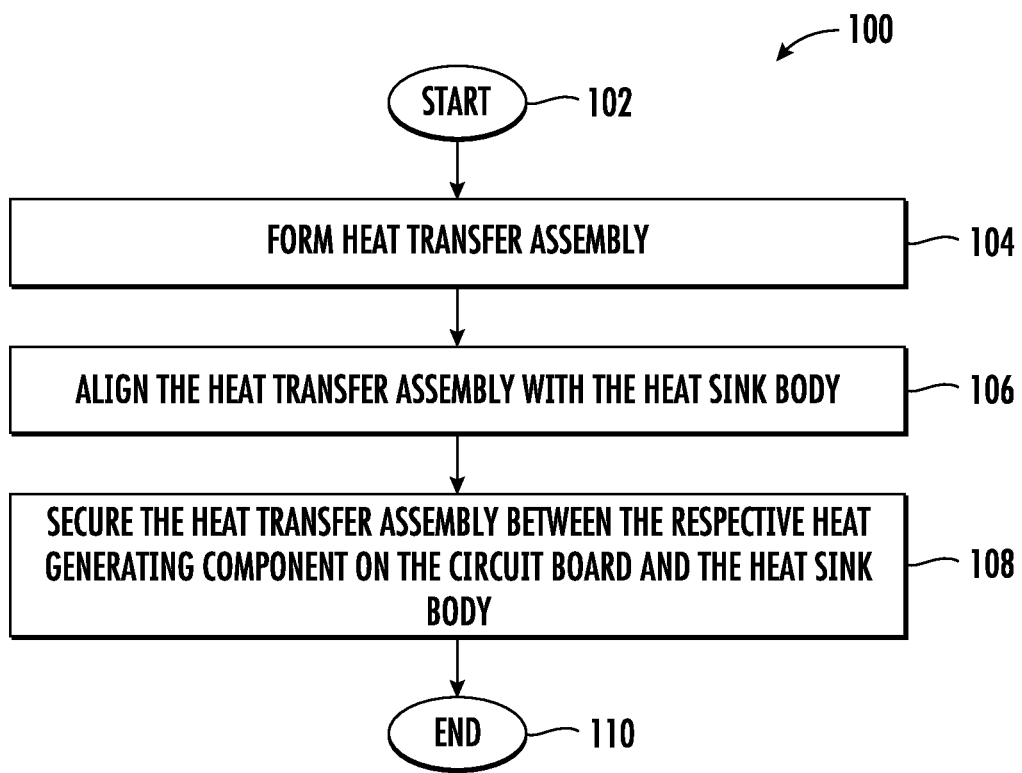
FIG. 5 is a high-level flow chart illustrating a method of making the electronic device of FIG. 1.

Referring now to FIG. 5, a high-level flowchart illustrates a method of making the electronic device 20,20' of FIGS. 1-4 and is illustrated generally 100. The process starts (Block 102) and the heat transfer assembly 34,34' is formed (Block 104). The heat transfer assembly 34,34' is aligned with the heat sink body 30,30' (Block 106). The heat transfer assembly 34,34' is secured by a magnet body 64',68' or fastener 56 between the respective heat generating component 28,28' on the circuit board 24,24' and the heat sink body 30,30' (Block 108). The process ends (Block 110).

Figure 6:
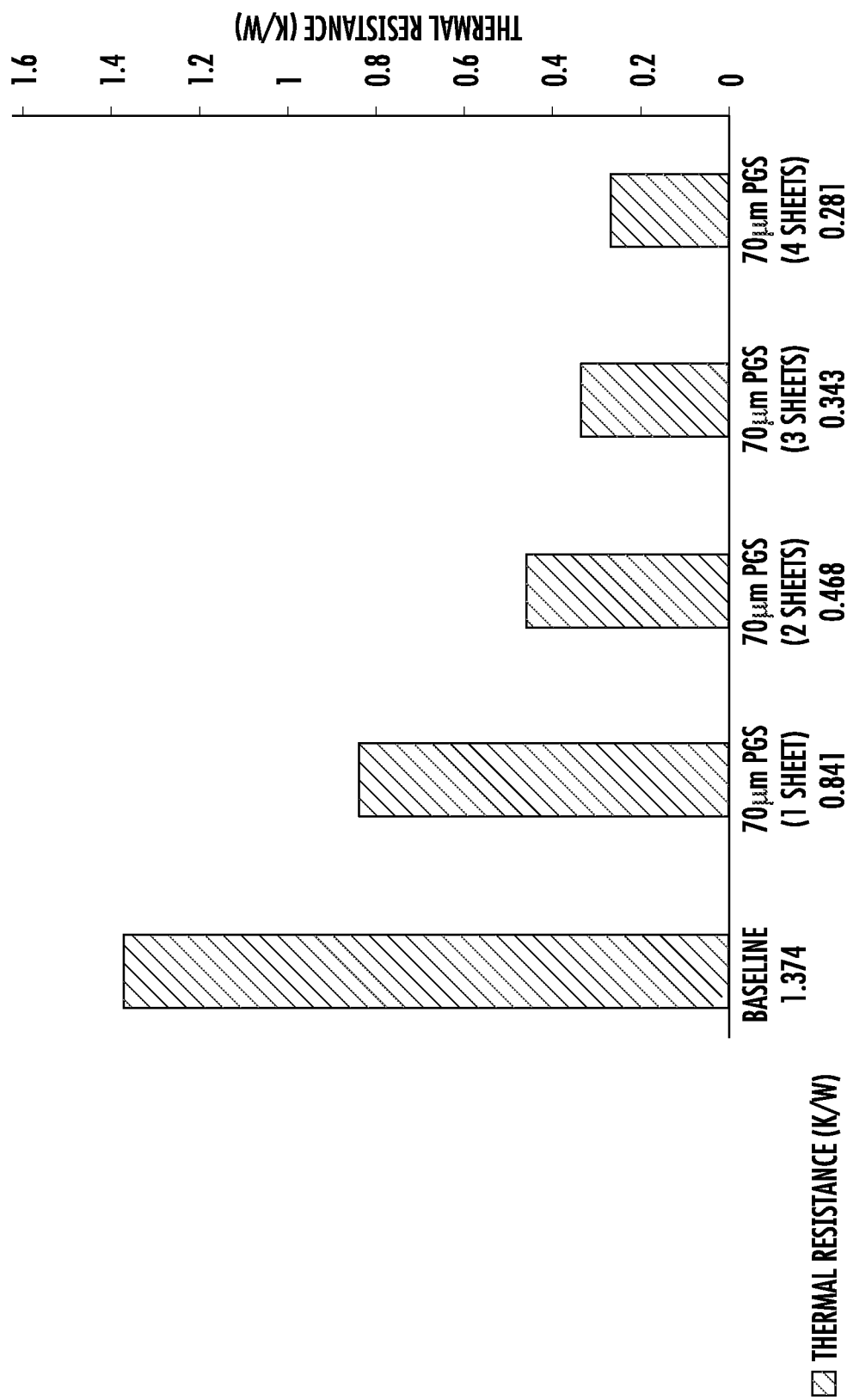
FIG. 6 is a bar chart showing thermal resistance comparisons for a state-of-the-art electronic device having a 40-60 mil thermal interface material (TIM) and the electronic device using different thickness PGS for a compressible layer similar to the electronic devices shown in FIGS. 1-4.

Referring now to FIG. 6, there is illustrated a bar chart that demonstrates the thermal conductive potential of the compressible layer 46,46' and the flexible, heat conductive layer 36,36' to remove heat. Analytical resistances have been computed and compared to a typical state-of-the-art, injectable thermal interface material (TIM) of 40-60 mils thickness (1 W/mK) that is connected between the lid of a heat generating component and a heat sink body and shows the baseline of thermal resistance k\w of 1.374 based on the height along the vertical axis. The four successive bars from left to right along the horizontal axis represent a successive increase in the number of sheets of 70 micrometer thickness PGS and showing one sheet, two sheets, three sheets, and four sheets as a compressible layer 46,46', and a 1 mil thermal grease bond line for the conductive layer 60,60' of about 0.73 w\mK. Each sheet is about 800 w\mK, allowing a 39% reduction improvement in thermal resistance with one sheet and showing 79% reduction in thermal resistance when four sheets are stacked to form a 40-60 mil compressible layer 46,46'.

Figure 7:
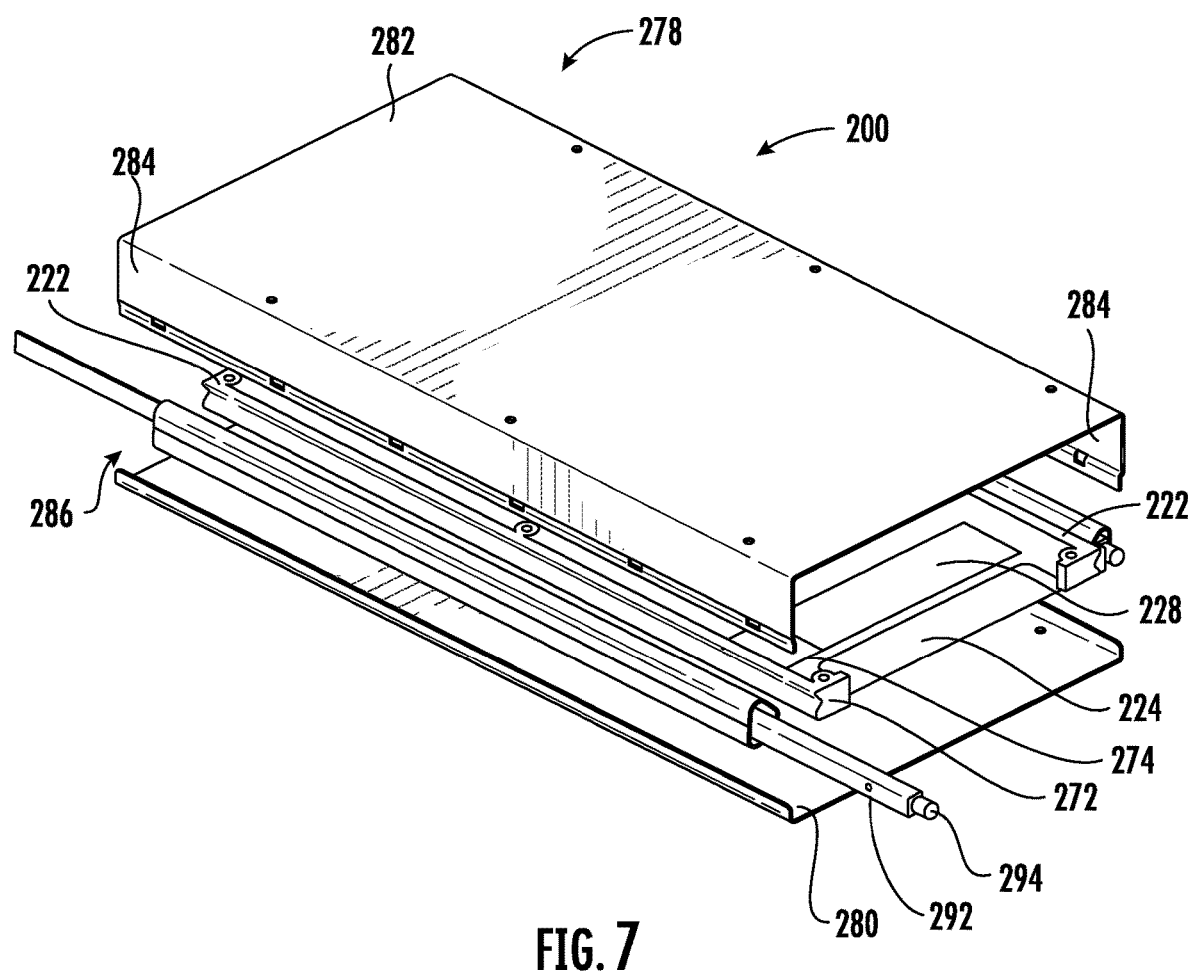
FIG. 7 is an exploded isometric view of an electronic device using a heat transfer clamp between a heat transfer rail and housing in accordance with a non-limiting example.
Figure 8:
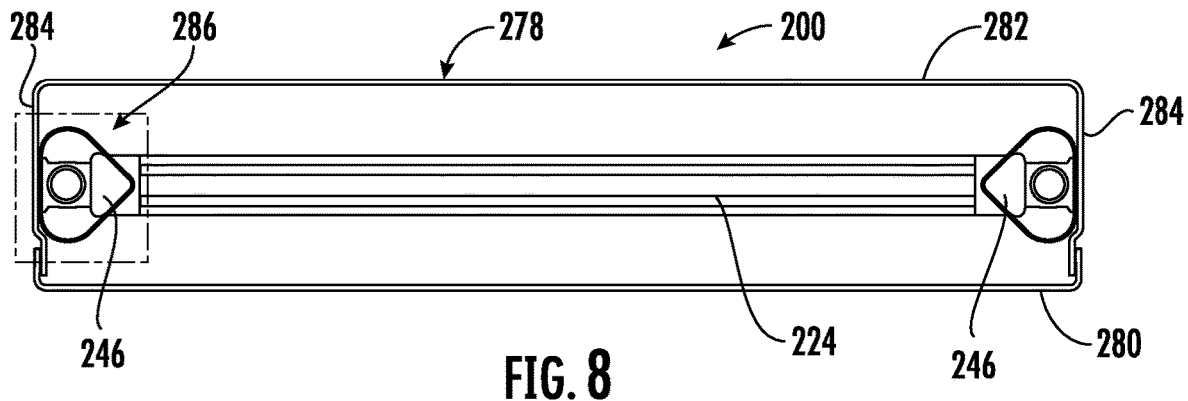
FIG. 8 is a sectional view of the heat transfer clamp, heat transfer rail, and the housing of FIG. 7.
Figure 9:
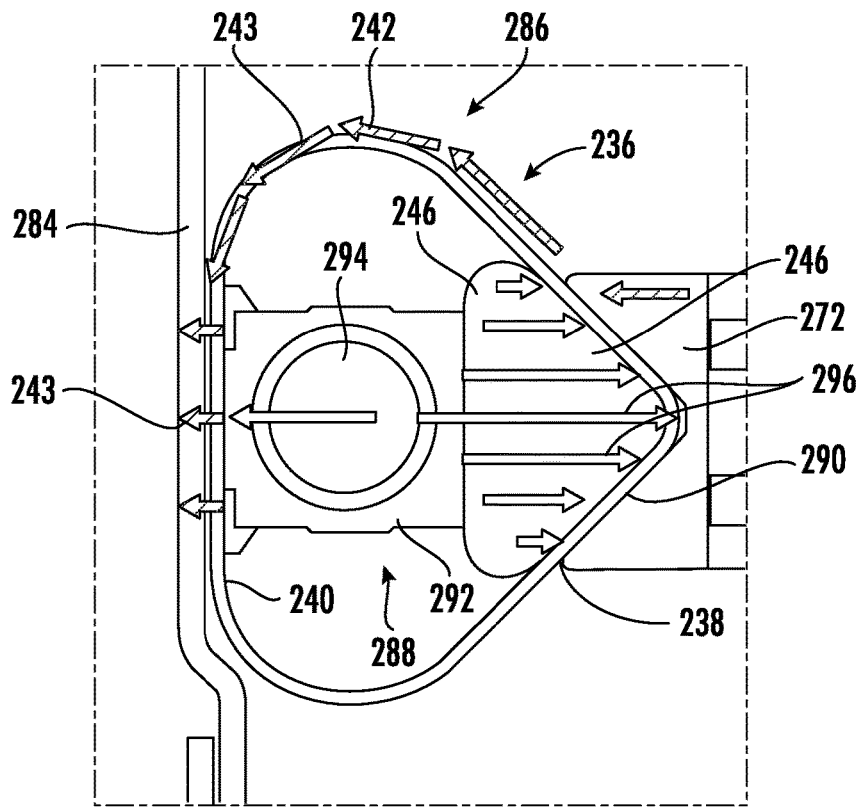
FIG. 9 is an enlarged sectional view of the heat transfer clamp, heat transfer rail, and housing.

Referring now to FIGS. 7-9, there is illustrated an electronic device 200 similar in function to the electronic devices 20,20' described relative to FIGS. 1-4. This electronic device 200 instead uses a heat transfer rail 272 that extends along an edge of the circuit board 224 coupled to the heat generating component 228. For description purposes, the same reference numerals used relative to FIGS. 1-4 are also used for common, functional components in the description of the electronic device 200 of FIGS. 8-10, except the reference numerals begin in the 200 series.

The electronic device 200 includes a circuit board 224 and heat generating component 228 carried by the circuit board. In this example, a heat transfer rail 272 extends along each side edge of the circuit board 224 and is coupled for heat transfer to the heat generating component 228. The circuit board 224 may form the conductive coupling. Any type of heat transfer coupling mechanism 274, such as heat transfer strips on the circuit board 224, may be used to transfer heat from the heat generating component 228 that is carried by the circuit board 224 to the heat transfer rail 272. A housing 278 encloses the circuit board 224, and in this example, includes a bottom housing section 280 on which the circuit board 224 may rest and be secured, and a top housing section 282 that includes side housing sections 284 that engage the bottom housing section. A heat transfer clamp 286 is positioned between the heat transfer rail 272 and the side housing section 284 as best shown in FIGS. 8 and 9. The heat transfer clamp 286 includes a flexible, heat conductive layer 236 (FIG. 9), such as a pyrolytic graphite sheet or flexible copper sheet as explained relative to the flexible heat conductive layer 36,36' of FIGS. 1-4, and includes a first portion 238 in thermal contact with the heat transfer rail 272 and a second portion 240 in thermal contact with the housing 278, and more particularly, the side housing section 284. The first and second portions 238, 240 are thermally coupled to each other via sidewall portions 242 to form a flexible heat conductive strap where the heat conduction path is indicated by the arrow 243. A clamp 288 and a compressible layer 246 is between the first and second portions 238, 240 of the flexible, heat conductive layer 236 as best shown in FIG. 9.

In an example, the heat transfer rail 272 has a v-shaped surface groove 290 that engages the first portion 238 of the flexible, heat conductive layer 236 that is configured and bent into a pyramidal shape that corresponds and conforms to the pyramidal shape of the compressible layer 236 in cross-section as shown best in FIGS. 8 and 9 and engages the v-shaped groove. This compressible layer 246 may be formed as a compressible matrix having a phase change material within the compressible matrix as described relative to the electronic device 20,20' in FIGS. 1-4.

The clamp 288 may be formed as a wedge clamp body 292 and includes a rotatable shaft 294 associated with the wedge clamp body. Other pressure inducing actuators besides the example wedge clamp body 292 may be used. The pyramidal configured compressible layer 246 may be secured onto the wedge clamp body 292 at the base of the body. The wedge clamp body 292 may be configured as a longitudinally extending rod that is rectangular in cross-section and includes its rotatable shaft 294 extending longitudinally through the wedge clamp body so that upon the rotation of the shaft, the corresponding pyramidal configured compressible layer 246 is forced against the first portion 238 of the flexible, heat conductive layer 236 that is in thermal contact with the v-shaped surface groove 290 of the transfer rail 272 as shown by the arrows at 296 designating the generated forces. The opposing end of the wedge clamp body 292 that carries the rotatable shaft 294 includes a planar surface that engages and is secured to the second portion 240 of the flexible, heat conductive layer 236, which in turn, is secured and in thermal contact with the interior of the side housing section 284 (FIG. 9). The rotatable shaft 294 is rotated and the wedge clamp body 292 is tightened against the heat transfer rail 272 for thermal transfer of heat through the compressible layer 246 and wedge clamp body 292 and via the flexible, heat conductive layer 236 such as a pyrolytic graphite sheet or copper sheet.

Figure 10:
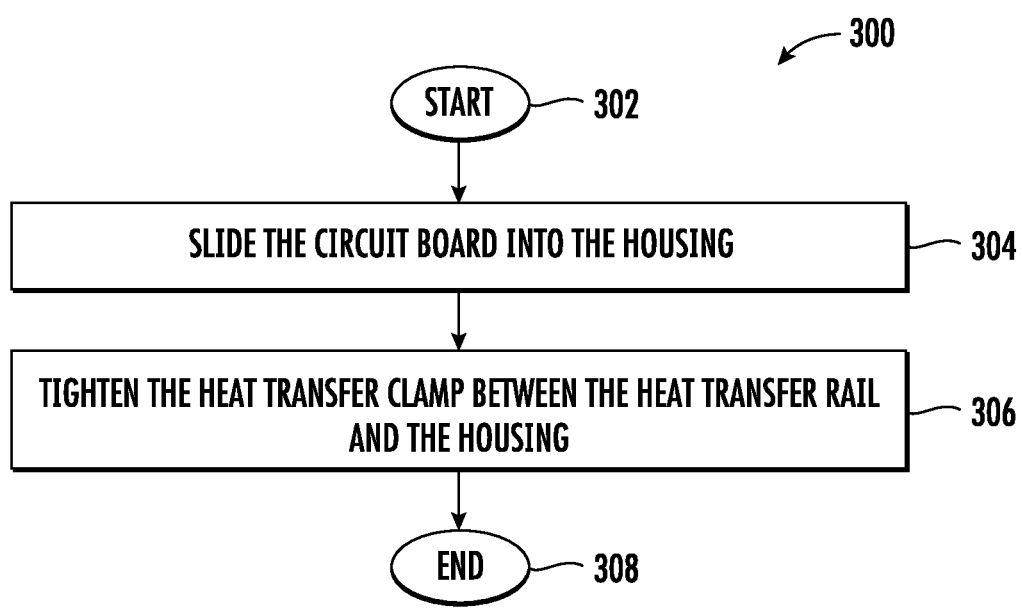
FIG. 10 is a flow diagram illustrating a method of securing a circuit board within a housing for the electronic device of FIG. 7.

Referring now to FIG. 10, there is illustrated generally at 300 a high-level flowchart showing a method for securing the circuit board 224 within the housing 278. The circuit board 224 carries a heat generating component 228 and the heat transfer rail 272 extends along an edge of the circuit board. The method starts (Block 302) by sliding the circuit board 224 into the housing 278 (Block 304). The heat transfer clamp 286 is tightened between the heat transfer rail 272 and the housing 278 so that the flexible, heat conductive layer 236 has its first portion 238 pressed in thermal contact with the heat transfer rail and has its second portion 240 already engaged in thermal contact with the housing 278 via the clamp 288 and compressible layer 246 (Block 306). The process ends (Block 308).

This application is related to copending patent application entitled, "ELECTRONIC DEVICE HAVING FLEXIBLE, HEAT CONDUCTIVE LAYER AND ASSOCIATED METHODS," which is filed on the same date and by the same assignee and inventors, the disclosure which is hereby incorporated by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. An electronic device comprising:
   a circuit board;
   a heat generating component carried by the circuit board;
   a heat transfer rail extending along an edge of the circuit board and coupled to the heat generating component;
   a housing covering the circuit board; and
   a heat transfer clamp between the heat transfer rail and the housing, the heat transfer clamp comprising
      a flexible, heat conductive layer comprising a first portion in thermal contact with the heat transfer rail and a second portion in thermal contact with the housing, the first and second portions being thermally coupled, and
      a clamp and a compressible layer thereon between the first and second portions of the flexible, heat conductive layer.

2. The electronic device of claim 1 wherein the compressible layer comprises a compressible matrix.

3. The electronic device of claim 2 comprising a phase change material within the compressible matrix.

4. The electronic device of claim 1 wherein the flexible, heat conductive layer is in the shape of a loop comprising at least one sidewall portion coupled between the first and second portions.

5. The electronic device of claim 1 wherein the clamp comprises a wedge clamp body and a rotatable shaft associated therewith.

6. The electronic device of claim 1 wherein the heat transfer rail has a v-shaped surface in contact with the first portion of the flexible, heat conductive layer.

7. The electronic device of claim 1 wherein the flexible, heat conductive layer comprises at least one of graphite and copper.

8. A heat transfer clamp to be positioned between a heat transfer rail coupled to a circuit board and a housing covering the circuit board, the heat transfer clamp comprising:
   a flexible, heat conductive layer comprising a first portion to be positioned in thermal contact with the heat transfer rail and a second portion to be positioned in thermal contact with the housing, the first and second portions being thermally coupled, and
   a clamp and a compressible layer thereon between the first and second portions of the flexible, heat conductive layer.

9. The heat transfer clamp of claim 8 wherein the compressible layer comprises a compressible matrix.

10. The heat transfer clamp of claim 9 comprising a phase change material within the compressible matrix.

11. The heat transfer clamp of claim 8 wherein the flexible, heat conductive layer has a loop shape comprising at least one sidewall portion coupled between the first and second portions.

12. The heat transfer clamp of claim 8 wherein the clamp comprises a wedge clamp body and a rotatable shaft associated therewith.

13. The heat transfer clamp of claim 8 wherein the heat transfer rail has a v-shaped surface in contact with the first portion of the flexible, heat conductive layer.

14. The heat transfer clamp of claim 8 wherein the flexible, heat conductive layer comprises at least one of graphite and copper.

15. A method for securing a circuit board within a housing, the circuit board having a heat generating component carried thereby and a heat transfer rail extending along an edge of the circuit board, the method comprising:
   sliding the circuit board into the housing; and
   tightening a heat transfer clamp between the heat transfer rail and the housing, the heat transfer clamp comprising
      a flexible, heat conductive layer comprising a first portion in thermal contact with the heat transfer rail and a second portion in thermal contact with the housing, the first and second portions being thermally coupled, and
      a clamp and a compressible layer thereon between the first and second portions of the flexible, heat conductive layer.

16. The method of claim 15 wherein the compressible layer comprises a compressible matrix.

17. The method of claim 16 comprising a phase change material within the compressible matrix.

18. The method of claim 15 wherein the flexible, heat conductive layer has a loop shape comprising at least one sidewall portion coupled between the first and second portions.

19. The method of claim 15 wherein the clamp comprises a wedge clamp body and a rotatable shaft associated therewith.

20. The method of claim 15 wherein the heat transfer rail has a v-shaped surface in contact with the first portion of the flexible, heat conductive layer.

21. The method of claim 15 wherein the flexible, heat conductive layer comprises at least one of graphite and copper.

\* \* \* \* \*